(12) United States Patent
Toshima

(10) Patent No.: US 10,114,065 B2
(45) Date of Patent: Oct. 30, 2018

(54) PULSED ELECTRON BEAM CURRENT PROBE AND METHODS OF OPERATING THE SAME

(71) Applicant: SANDISK TECHNOLOGIES LLC, Plano, TX (US)

(72) Inventor: Norio Toshima, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 10 days.

(21) Appl. No.: 15/266,273

(22) Filed: Sep. 15, 2016

(65) Prior Publication Data

US 2017/0176513 A1 Jun. 22, 2017

Related U.S. Application Data

(60) Provisional application No. 62/269,546, filed on Dec. 18, 2015.

(51) Int. Cl.
*G01R 31/26* (2014.01)
*G01R 31/265* (2006.01)
*G01R 27/02* (2006.01)

(52) U.S. Cl.
CPC ......... *G01R 31/2653* (2013.01); *G01R 27/02* (2013.01)

(58) Field of Classification Search
USPC .................. 324/537, 525, 754.22; 250/310
See application file for complete search history.

(56) References Cited

U.S. PATENT DOCUMENTS

| | | | | | |
|---|---|---|---|---|---|
| 5,747,999 | A | * | 5/1998 | Yamaoka | G01R 31/311 257/E21.53 |
| 6,008,716 | A | * | 12/1999 | Kokubun | H01L 23/5258 257/529 |
| 6,947,587 | B1 | * | 9/2005 | Maeda | G01N 21/95607 382/144 |
| 9,449,924 | B2 | | 9/2016 | Takaki | |
| 2005/0045820 | A1 | * | 3/2005 | Ohshima | H01J 37/244 250/310 |
| 2008/0157750 | A1 | * | 7/2008 | Li | G01J 3/42 324/76.21 |
| 2016/0149002 | A1 | | 5/2016 | Sharangpani et al. | |

OTHER PUBLICATIONS

Hitachi High-Technologies Corporation, Japanese, http://www.hitachi-hightech.com/jp/product_detail/?pn=em-ne4000,"nanoEBAC® NE4000," 2 pages, (2001).
Hitachi High-Technologies Europe GmbH, European, http://www.hitachi-hightech.com/eu/product_detail/?pn=em-ne4000, Electron Beam Absorbed Current (EBAC) Characterization System nanoEBAC NE4000, 3 pages, (2016).

* cited by examiner

*Primary Examiner* — Vincent Q Nguyen
(74) *Attorney, Agent, or Firm* — The Marbury Law Group PLLC

(57) ABSTRACT

An electron beam absorbed current measurement method includes connecting a conductive probe to a conductive structure of a sample, irradiating a pulsed electron beam along the conductive structure to generate an alternating current in the conductive probe, and determining a presence of a high resistance defect in the conductive structure based on at least one of a delay of a rising edge of the alternating current waveform and a decrease in amplitude of the alternating current waveform.

3 Claims, 8 Drawing Sheets

PULSED ELECTRON BEAM CURRENT PROBE AND METHODS OF OPERATING THE SAME

RELATED APPLICATIONS

This application claims the benefit of priority of U.S. Provisional Application No. 62/269,546 filed on Dec. 18, 2015, which is incorporated herein by reference in its entirety.

FIELD

The present disclosure relates generally to the field of measurement apparatuses, and specifically a pulsed electron beam current probe and methods of operating the same.

BACKGROUND

An electron beam current probe is a conductive probe that employs an electron beam to measure electrical current through a target structure. An electron beam probe operates on a similar principle as a scanning electron microscope (SEM). While a SEM typically operates at a voltage of about 30 eV, an electron beam probe operates at a voltage of about 1 keV. By measuring electrical current flow through a conductive probe attached to a portion of a target, the electrical resistance between an irradiation point and the contact point of the conductive probe can be measured.

SUMMARY

According to an aspect of the present disclosure an electron beam absorbed current measurement method includes connecting a conductive probe to a conductive structure of a sample, irradiating a pulsed electron beam along the conductive structure to generate an alternating current in the conductive probe, and determining a presence of a high resistance defect in the conductive structure based on at least one of a delay of a rising edge of the alternating current waveform and a decrease in amplitude of the alternating current waveform.

According to an aspect of the present disclosure, a method of characterizing a resistive property of a sample is provided, which comprises: connecting one end of a conductive probe to an amplifier and another end of the conductive probe to a conductive structure of a sample; performing at least one scan by irradiating a pulsed electron beam along a scan path on a sample at least once, the scan path overlying a conductive structure within the sample, wherein a time-dependent input electrical current is provided into an input node of the amplifier, and the amplifier converts the time-dependent input electrical current into a time-dependent output voltage signal; measuring a change in a measurement parameter of the time-dependent output voltage signal as the irradiated pulsed electron beam moves along the scan path, wherein the measurement parameter comprises at least one quantity selected from irradiation-location-dependent peak magnitudes of pulses in the time-dependent output voltage signal, irradiation-location-dependent pulse signal rise times of pulses in the time-dependent output voltage signal, and irradiation-location-dependent signal decay times in the time-dependent output voltage signal; and determining (e.g., calculating by running an automated program on a processor coupled with a memory) local variations in resistivity of material portions underlying the scan path by correlating the change in the measurement parameter of the time-dependent output voltage signal with a corresponding change in local resistivity.

According to another aspect of the present disclosure, a single probe resistivity measurement device is provided, which comprises: an electron beam source configured to emit a pulsed electron beam; a beam control system configured to continuously change a location of irradiation on a target that is irradiated with the pulsed electron beam; a conductive probe configured to contact a conductive structure on the target; an amplifier connected to the conductive probe and configured to convert a time-dependent input electrical current into a time-dependent output signal; and a variable capacitor connected between the amplifier and electrical ground and configured to provide one setting among a plurality of settings for capacitance between the amplifier and the electrical ground.

DETAILED DESCRIPTION

Figure 1:
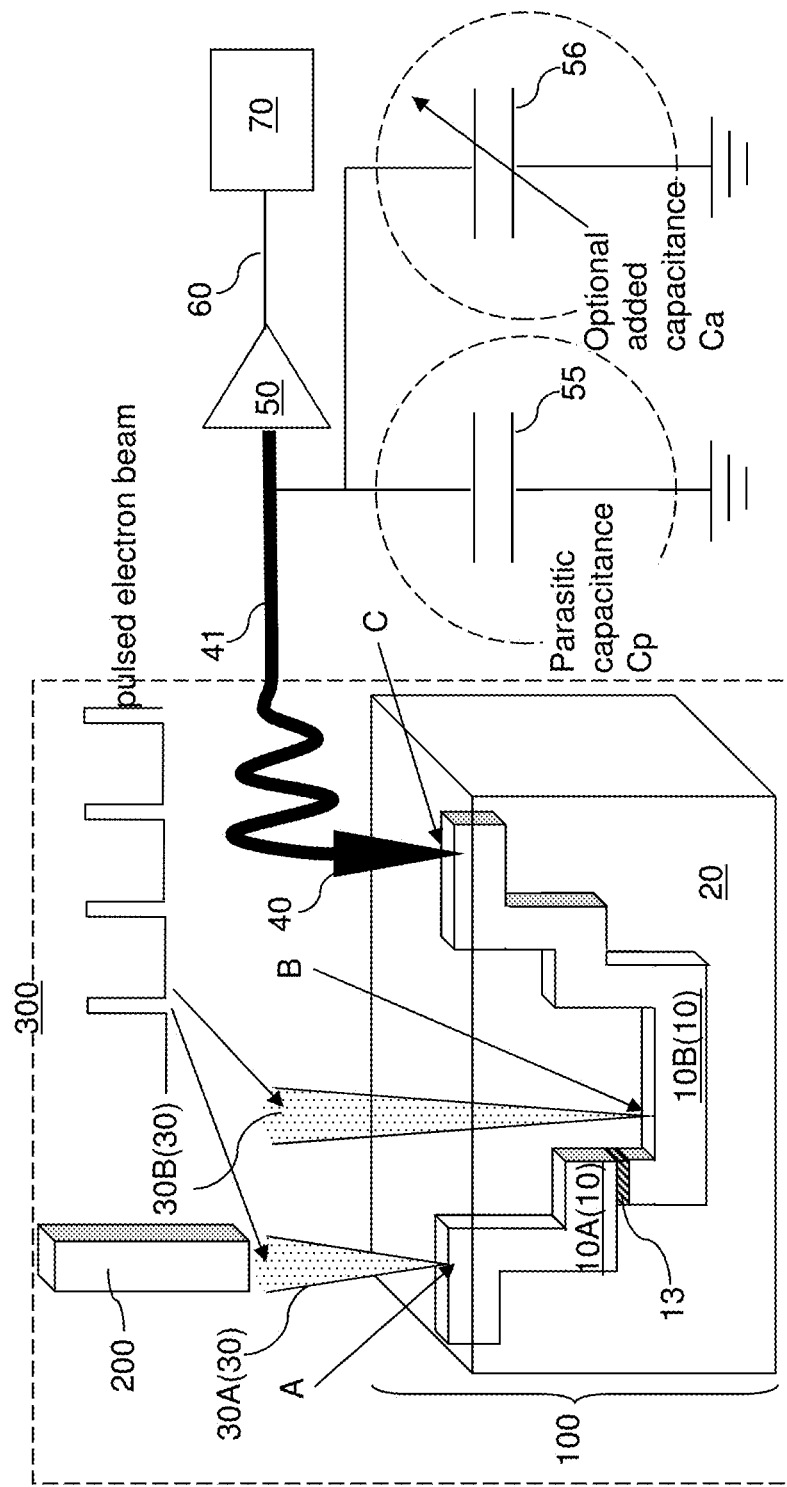
FIG. 1 is a schematic diagram of a single probe resistivity measurement device and a sample under examination in operation according to an embodiment of the present disclosure.

As discussed above, the present disclosure is directed to a pulsed electron beam current probe and methods of operating the same, the various aspects of which are described below. The embodiments of the disclosure can be employed to probe various semiconductor devices or conductive (e.g., metal) interconnect (including conductive via) structures to detect electrical opens or electrical shorts with a greater sensitivity than previously possible. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

In an electron beam absorbed current (EBAC) probing using only one probe, a high resistance defect may not result in an electrical open, but can merely result in an increase in resistance (i.e., a high resistance defect which is not an open circuit defect). Such a high resistance defect cannot be detected employing conventional EBAC probing. This is because even if there is a defective point with high resistance, a location of this point cannot be detected if current can be flowed despite the presence of this point. Only those high resistances in the vicinity of an open circuit point can be detected.

A differential amplifier employing two probes is capable of high resistance defect detection. However, since two measurement probes are necessary in this configuration, this method can only be applied to cases where both ends of the defective line are physically exposed.

The present inventor realized that in some embodiments of the present disclosure the high resistance defect may be detected using pulsed electron beam in a single probe electron beam absorbed current ("EBAC") method (i.e., in which only one probe contacts the conductive structure).

One embodiment of the pulsed electron beam EBAC method includes connecting a conductive probe to a conductive structure of a sample, irradiating the pulsed electron beam along the conductive structure to generate an alternating current in the conductive probe, and determining a presence of a high resistance defect in the conductive structure based on at least one of a delay of a rising edge of the alternating current waveform and a decrease in amplitude of the alternating current waveform. In one embodiment, the measurement comprises a single probe measurement method in which only one conductive probe is connected to the conductive structure, and the high resistance defect comprises a region of higher resistivity in the conductive sample than adjacent regions in the conductive sample.

In one embodiment, determining the presence of the high resistance defect in the conductive structure is based on both the delay in the rising edge of the alternating current waveform and the decrease in amplitude (i.e., magnitude) of the alternating current waveform. In other embodiments, determining the presence of the high resistance defect in the conductive structure is based only on the delay in the rising edge of the alternating current waveform or only on the decrease in amplitude of the alternating current waveform.

In one embodiment, determining a presence of the high resistance defect in the conductive structure comprises providing a graphic output of a local resistivity distribution of the conductive structure showing a presence of the high resistance defect, as will be described in more detail below.

In one alternative embodiment, irradiating the pulsed electron beam comprises performing plural scans of the pulsed electron beam along the conductive structure using different electron beam pulse frequency for each of the plural scans. In another alternative embodiment, irradiating the pulsed electron beam comprises performing plural scans of the pulsed electron beam along the conductive structure using different external capacitance electrically connected between ground and an amplifier electrically connected to the conductive probe for each of the plural scans.

Any suitable conductive structure may be measured using the above described EBAC method. For example, the conductive structure may be a conductive interconnect (e.g., including a conductive line and/or a conductive via) embedded in a dielectric matrix located over a substrate, such as a silicon wafer. The conductive interconnect is electrically connected to semiconductor device located over the substrate. The semiconductor device may comprise any suitable device, such as a transistor or diode, or it may comprise a memory device, such as a NAND string or a resistive random access memory ("ReRAM") device.

In one embodiment, to determine a location of the high resistivity defect in the conductive via as a function of height of the conductive via (i.e., as a function of distance to the substrate) the conductive structure containing the conductive via is tilted relative to the pulsed electron beam during the scan of the electron beam.

Additional details of the method and apparatus of the embodiments of the present disclosure are described below in reference to the figures.

Referring to FIG. 1, a schematic diagram of a single probe resistivity measurement device coupled with a sample 100 under examination in operation is shown with an EBAC image generated therefrom according to an embodiment of the present disclosure. The single probe resistivity measurement device includes a vacuum enclosure in which an electron beam source 200 and the sample 100 under examination are disposed. The vacuum enclosure 300 may include suitable vacuum ports for loading the sample 100 under examination and for servicing various components within the volume of the vacuum enclosure 300. At least one vacuum pump (not shown) can be connected to the vacuum enclosure 300 to pump gas out of the vacuum enclosure 300 and to maintain the volume within the vacuum enclosure 300 at a suitable base pressure, which can be, for example, in a range from $1.0 \times 10^{-11}$ Torr to $1.0 \times 10^{-6}$ Torr, although lower and higher base pressures may be employed. The sample 100 under examination is also referred to as device under test (DUT).

The sample 100 under examination can include a plurality of conductive structures 10 and at least one high-resistivity region 13 caused by structural defects formed during manufacturing of the sample 100, or formed during operation of the sample 100 after manufacturing. Each high-resistivity region 13 is a region having a greater resistivity than the conductive material of the conductive structures 10. A high-resistivity region 13 may include an insulator, a void, a semiconducting material, a structural defect in a conductive material or a semiconducting material, or a compositional change in the conductive material of a conductive structure 10 that renders the region less conductive. The high-resistivity region 13 can have a resistivity that is greater than the resistivity of the conductive structures 10 at least by a factor of 2, such as a factor between 10 and $10^{20}$, for example between 100 and $10^{10}$. The sample 100 can include a semiconductor device and/or a metal interconnect structure. For example, the sample 100 can include an integrated circuit with metal interconnect structures thereupon. The plurality of conductive structures 10 includes a conductive material, which may be a metallic material or a heavily doped semiconductor material.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The conductive structures 10 can be embedded in a dielectric matrix 20 including a dielectric material, which can be, for example, silicate glass (i.e., silicon oxide), silicon nitride, silicon oxynitride, organosilicate glass (OSG), a dielectric metal oxide, or other dielectric materials that can be employed to embed a conductive material therein. The conductive structure 10 can include a metallic element (such as Cu, W, or Al), an intermetallic alloy, a conductive metal nitride, a conductive metal carbide, a conductive metal-semiconductor alloy (such as a metal silicide), or a combination or a stack thereof. In one embodiment, the conductive structures 10 can be embodied as a metal interconnect structure including at least one metal line and at least one metal via structure, which may stand alone or may be formed on an underlying semiconductor circuitry.

Each high-resistivity region 13 may include an insulating material, a semiconducting material, a void (e.g., a partial discontinuity which does not form an open circuit defect) in the conductive structure 10 and/or a narrowing in the conductive structure 10. Depending on the thickness of each high-resistivity region 13, the resistance of the high-resistivity region 13 between two conductive structures 10 can be at a level that induces an easily observable electrical open, or may be at a level that decreases electrical current therethrough to a level that is not detected as an electrical open. For example, if the high-resistivity region 13 is thin enough (e.g., having a thickness in a range from 0.5 nm to 5 nm), the electrical characteristic of the high-resistivity region 13 may be mere decrease in electrical current in a range from 1% to 50%, providing an overall electrically conductive path including the high-resistivity region 13 albeit with a lesser electrical current.

The single probe resistivity measurement device of the present disclosure can include an electron beam source 200 configured to emit an electron beam 30. The electron beam 30 is a focused beam that impinges on an irradiation point (A or B) located on the at least one conductive structure 10 embedded in the dielectric matrix 20. The electron beam 30 is illustrated at two positions in FIG. 1. A first electron beam 30A corresponds to the location of the electron beam while irradiating a first irradiation point A, and a second electron beam 30B corresponds to the location of the electron beam while irradiating a second irradiation point B.

The single probe resistivity measurement device can be configured to provide relative movement between the sample 100 under examination and the electron beam source 200 by laterally (i.e., along a direction perpendicular to the direction of the electron beam 30) moving at least one of the sample 100 under examination and the electron beam source 200 within the vacuum enclosure 300. The movement of the electron beam 30 across a continuous set of points on the at least one conductive structure 10 and the at least one high-resistivity region 13 (if present) defines a scan path. During an electron beam scan, the electron beam can move continuously between the positions of the first electron beam 30A and the second electron beam 30B and beyond.

The scan path overlying the at least one conductive structure 10 within the sample 100, and may overlie one or more high-resistivity region 13 if present within the sample 100. The at least one conductive structure 10 may include multiple conductive structures such as a first conductive structure 10A and a second conductive structure 10B. For example, the scan path may include point A located on the first conductive structure 10A (located above, or at the left side of, the high-resistivity region 13 in FIG. 1), point B located on the second conductive structure 10B (located below, or at the right side of, the high-resistivity region 13 in FIG. 1), and a set of additional points that forms a continuous line between point A and point B and located across the first conductive structure 10A, the high-resistivity region 13 (if present) between the first and second conductive structures 10, and the second conductive structure 10B.

A conductive probe (40, 41) can include a conductive tip 40 having a pointed end. The conductive tip 40 can physically contact, or protrude through, a surface of a conductive structure 10 (such as the second conductive structure 10B as illustrated in FIG. 1) to provide electrical contact to a section of the conductive structure 10 (i.e., to be electrically shorted to the section of the conducive material portion 10). The conductive tip 40 can comprise a sharpened metallic tip such as a tungsten tip, or any other suitable tip material known in the art. The conductive tip 40 can make a physical contact with a region of a conductive structure 10 (such as the second conductive structure 10B illustrated in FIG. 1), which is herein referred to as a contact point C. The conductive probe (40, 41) can include a conductive cable 41 that is connected to the conductive tip 40 and providing electrical connection between the conductive tip 40 and an input node of an amplifier 50. The amplifier 50 may be an operational amplifier having a first input node connected to an end of the conductive cable 41 and a second input node connected to electrical ground. Upon loading of the sample 100 under examination into the vacuum enclosure, one end (i.e., the conductive cable end) of the conductive probe (40, 41) can be connected to the amplifier 50 and another end (i.e., the conductive tip end) of the conductive probe (40, 41) can be connected to a conductive structure 10 (such as the second conductive structure 10B) of the sample 100 under examination.

The electron beam 30 can be a pulsed electron beam having a pulse pattern illustrated in FIG. 1. In one embodiment, the pulsed electron beam can have a periodic wave pattern. The periodic waver pattern can be, for example, a square wave pattern having a fixed duty cycle and a fixed frequency. The frequency can be in a range from 10 Hz to 10 MHz, although lower and higher frequencies can also be employed. The duty cycle can be in a range from 0.01% to 50% (such as from 0.1% to 10%), although lesser and greater duty cycles can also be employed. The electron beam 30 can be scanned across a respective scan path during each scan. In one embodiment, multiple scans can be performed employing different scan paths, and the pulsed electron beam can be irradiated at the fixed frequency and at the fixed duty cycle during each of the multiple scans.

A fraction of the electrons that impinge on the moving irradiation point across the scan path flows through any low resistance path between the irradiation point and the contact point C. The fraction of the electrons that flow to the contact point C defines an "absorbed current," which is the input to the amplifier 50. The lower the total resistance of the low resistance path, the greater the fraction of electron current that flows to the contact point C with respect to the total electrical current during the active duty cycle of the electron beam 30. If the total resistance between the irradiation point (e.g., point A or point B) and the contact point C is significantly high, the fraction of electron current that flows to the contact point C with respect to the total electrical current during the active duty cycle of the electron beam 30 may be insignificant.

If the electron beam 30 is periodic, the electrical current caused by the flow of electrons from the irradiation point to the contact point C can be periodic. In this case, a time-dependent input electrical current is provided into an input node of the amplifier 50. The amplifier 50 converts the time-dependent input electrical current into a time-dependent output voltage signal 60.

Optionally, a sample and hold circuitry 70 may be connected to the output of the amplifier 50 to convert the time-dependent output voltage signal 60 into a processed voltage signal. Specifically, the sample and hold circuitry 70 can be configured to hold a peak magnitude of the time-dependent output voltage signal 60 for a duration that is less than the period of the pulsed electron beam, thereby detecting the magnitude of the peak voltage of the time-dependent output voltage signal 70 for each pulse in the electron beam 30 as the irradiation point moves during the scan.

A parasitic capacitance Cp is inherently present between the input node of the amplifier 50 connected to the conductive probe (40, 41) and electrical ground, which may be connected to the other input node of the amplifier 50 in case the amplifier is an operational amplifier, or connected to the electrical ground of the amplifier 50 in case the amplifier 50 has only one input node. The effect of the parasitic capacitance Cp is represented by a parasitic capacitor 55 in FIG. 1. The parasitic capacitance Cp may be in range from 10 fF to 1 nF depending on the setup of the instrumentation. An optional additional capacitance Ca can be added to the parasitic capacitance Cp to increase the total capacitance between the input node of the amplifier 50 connected to the conductive probe (40, 41) and electrical ground. The additional capacitance Ca may be provided by an external capacitor 56, which is a physical capacitor structure having a first node electrically shorted to the input node of the amplifier 50 and a second node electrically shorted to electrical ground. In one embodiment, the external capacitor 56 may be embodied as a fixed capacitance capacitor or as a variable capacitor providing a variable capacitance. The additional capacitance Ca can be in a range from 1 pF to 100 µF, although lesser and greater values can also be employed.

The finite resistance R between the irradiation point and the contact point C and the total capacitance (Cp+Ca) between the input node of the amplifier 50 and electrical ground defines an RC time constant given by the product of the resistance R and the total capacitance (Cp+Ca). The resistance R is a variable that depends on the location of the irradiation point, while the total capacitance (Cp+Ca) remains a constant during each scan. As the electron beam 30 moves along the scan path, the resistance R between the irradiation point and the input node of the amplifier 50 changes. For example, if a high-resistivity region 13 is on a least resistance path between a set of irradiation points and the contact point C at any time during the scan, the resistance R is significantly high for each irradiation point with the set. If a high-resistivity region 13 is not present on a least resistance path between an irradiation point and the contact point C and the least resistance path is entirely within at least one conductive structure 10, the resistance R is low for such an irradiation point.

The variable resistance R during the scan determines a variable RC time constant that changes with the location of the irradiation point across the sample 100 under examination during each scan. The combination of the variable resistance and the total capacitance (Cp+Ca) has the effect of providing a capacitance-resistance filter (CR filter) at the input node of the amplifier 50. The capacitance-resistance filter is a low pass filter that passes electrical signals with a low frequency and blocks electrical signals with a high frequency. The cutoff frequency fc of the CR filter is defined as $1/(2\pi RC)$, which defines a threshold frequency for blocking high frequency signals.

Generally speaking, a resistive property of a sample can be characterized employing the single probe resistivity measurement device of the present disclosure. The single probe resistivity measurement device includes an electron beam source 200 configured to emit a pulsed electron beam 30, a beam control system configured to continuously change a location of irradiation on a target that is irradiated with the pulsed electron beam (i.e., the sample 100 under examination), a conductive probe (40, 41) configured to contact a conductive structure 10 on the target, an amplifier 50 connected to the conductive probe (40, 41) and configured to convert a time-dependent input electrical current into a time-dependent output signal 60, and a capacitor 56 (which can be a capacitor having a fixed capacitance or a variable capacitance capacitor having multiple capacitance settings) connected between the amplifier 50 and electrical ground and configured to provide one selected setting among a plurality of settings for capacitance between the amplifier 50 and the electrical ground at a time.

In one embodiment, the resistive property of a sample can be characterized by performing at least one scan. Each scan can be performed by irradiating a pulsed electron beam along a respective scan path on the sample 100 under examination. The scan path can overlie a conductive structure 10 within the sample 100. A time-dependent input electrical current is provided into an input node of the amplifier 50. The amplifier converts the time-dependent input electrical current into a time-dependent output voltage signal 60. A change in a measurement parameter of the time-dependent output voltage signal 60 can be measured as the irradiated pulsed electron beam moves along the scan path.

Due to the variations in the resistance R between the irradiation point and the contact point C as the irradiation point changes across the scan path, various measurable parameters of the time-dependent output voltage signal 60 can change during each scan. At least one of the measurable parameters of the time-dependent output voltage signal 60 can be measured and analyzed, which include for example, peak magnitudes (i.e., amplitudes) of pulses in the time-dependent output voltage signal 60, pulse signal rise times of pulses in the time-dependent output voltage signal, and signal decay times in the time-dependent output voltage signal 60. These parameters are dependent on the location of the irradiation point, and thus, are respectively referred to as irradiation-location-dependent peak magnitudes of pulses in the time-dependent output voltage signal 60, irradiation-location-dependent pulse signal rise times of pulses in the time-dependent output voltage signal 60, and irradiation-location-dependent signal decay times in the time-dependent output voltage signal 60, respectively.

Thus, the measurement parameter can comprise at least one quantity selected from irradiation-location-dependent peak magnitudes of pulses in the time-dependent output voltage signal 60, irradiation-location-dependent pulse signal rise times of pulses in the time-dependent output voltage signal 60, and irradiation-location-dependent signal decay times in the time-dependent output voltage signal 60. An automated program can be run on a processor coupled with a memory to quantitatively characterize the variations in the measurement parameter. Specifically, local variations in resistivity of material portions underlying the scan path can be quantitatively calculated by correlating the change in the measurement parameter of the time-dependent output voltage signal 60 with a corresponding change in local resistivity.

In one embodiment, an increase in the peak magnitude of the time-dependent output voltage signal 60 corresponds to a decrease in local resistivity, and a decrease in the peak magnitude of the time-dependent output voltage signal 60 corresponds to an increase in local resistivity.

Figure 2A:
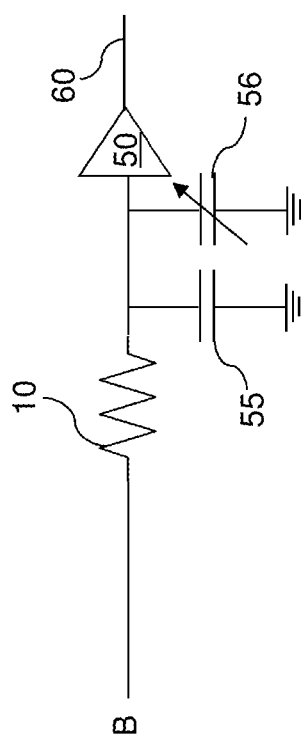
FIG. 2A is a schematic diagram illustrating electrical coupling between the sample and the amplifier when a high-resistivity region is not present in the path of irradiated electrons according to an embodiment of the present disclosure.
Figure 2B:
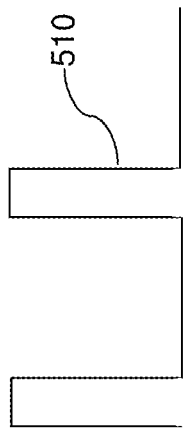
FIG. 2B is an exemplary pulse waveform for the electron beam according to an embodiment of the present disclosure.
Figure 2C:
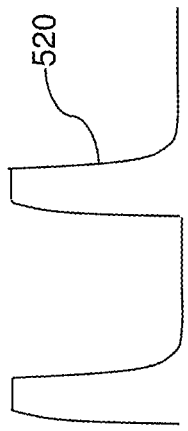
FIG. 2C is an exemplary waveform for the time-dependent output voltage signal from the amplifier according to an embodiment of the present disclosure.
Figure 3A:
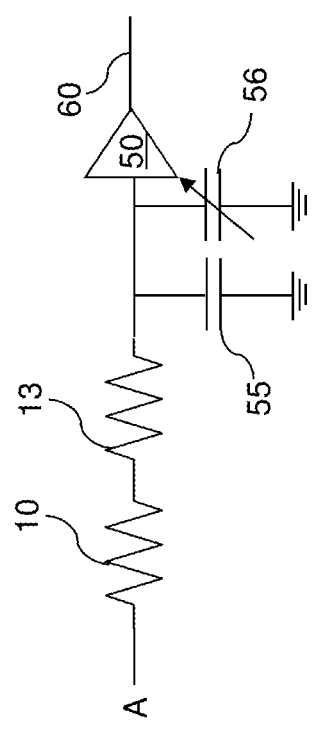
FIG. 3A is a schematic diagram illustrating electrical coupling between the sample and the amplifier when a high-resistivity region is present in the path of irradiated electrons according to an embodiment of the present disclosure.
Figure 3B:
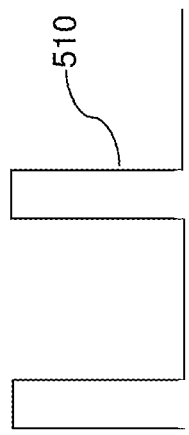
FIG. 3B is an exemplary pulse waveform for the electron beam according to an embodiment of the present disclosure.
Figure 3C:
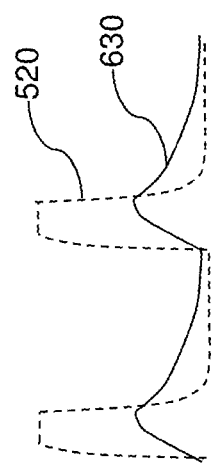
FIG. 3C is an exemplary waveform for the time-dependent output voltage signal from the amplifier according to an embodiment of the present disclosure.

FIGS. 2A-2C and 3A-3C illustrate the mechanism by which irradiation-location-dependent peak magnitudes of pulses in the time-dependent output voltage signal 60, irradiation-location-dependent pulse signal rise times of pulses in the time-dependent output voltage signal 60, or irradiation-location-dependent signal decay times in the time-dependent output voltage signal 60 can be employed to determine the local variations in resistivity of material portions underlying a scan path. FIGS. 2A-2C illustrate the operation of the single probe resistivity measurement device when the pulsed electron beam 30B irradiates the irradiation point B in FIG. 1. FIGS. 3A-3C illustrate the operation of the single probe resistivity measurement device when the pulsed electron beam 30A irradiates the irradiation point A in FIG. 1.

FIG. 2A illustrates electrical coupling between irradiation point B of the sample 100 under examination and the amplifier 50, which corresponds to a situation in which a high-resistivity region 13 is not present in the path of irradiated electrons. In other words, the resistance of the at least one conductive structure 10 is the only significant resistance in the path of the absorbed current. FIG. 2B is an exemplary pulse waveform 510 for the pulsed electron beam 30 as measured by the electrical current in the pulsed electron beam 30. As discussed above, the pulsed electron beam 30 can have a square wave pattern having a fixed duty cycle and a fixed frequency. FIG. 2C illustrates an exemplary waveform for 520 the time-dependent output voltage signal 60 from the amplifier 50. The frequency and the duty cycle of the pulsed electron beam 30 can be selected such that the signal rise time and the signal decay time are less than the duration of each pulse in the exemplary pulse waveform 510 for the pulsed electron beam 30. In addition, the capacitance of the external capacitor 56 (if present) can be selected to ensure that the signal rise time and the signal decay time are less than the duration of each pulse in the exemplary pulse waveform 510 for the pulsed electron beam 30.

The signal rise time in the time-dependent output voltage signal 60 can be measured by fitting the rising edge of the waveform 520 for the time-dependent output voltage signal 60 to an exponential function and calculating, for example, by running an automated program on a processor coupled with a memory, and by calculating the time constant of the fitted curve that provides a best fit (for example, by least square fitting method) to the measured rising edge of the waveform 520. The time constant of the fitted curve is the calculated signal rise time.

The signal decay time in the time-dependent output voltage signal 60 can be measured by fitting the falling edge of the waveform 520 for the time-dependent output voltage signal 60 to an exponential function and calculating, for example, by running an automated program on a processor coupled with a memory, and by calculating the time constant of the fitted curve that provides a best fit (for example, by least square fitting method) to the measured falling edge of the waveform for 520. The time constant of the fitted curve is the calculated signal decay time.

The signal rise time and the signal decay time are determined by the product of the resistance R of the electron path between the irradiation point B and the input node of the amplifier 50 and the total capacitance (Cp+Ca) of the parasitic capacitor 55 and the external capacitor 56 (if present). Thus, the signal rise time and the signal decay time can be the same. In one embodiment, the signal rise time and the signal decay time can be set to be on the order of, or to be less than, the duration of a single pulse in the pulsed electron beam 30. In one embodiment, the signal rise time and/or the signal decay time can be set to be in a range from 0.01% to 100% of the duration of a single pulse in the pulsed electron beam 30.

The inverse of the ratio of the signal rise time and/or the signal decay time to the duration of a single pulse in the pulsed electron beam 30 indicates the threshold magnitude of change in the resistance of the electron path that is required for detection of presence of a high-resistivity region 13. In other words, if the instrumentation is to be set to detect a change in resistance by a factor of 10 or greater, the ratio of the signal rise time and/or the signal decay time to the duration of a single pulse in the pulsed electron beam 30 is set to be about 10. If the instrumentation is to be set to detect a change in resistance by a factor of 3 or greater, the ratio of the signal rise time and/or the signal decay time to the duration of a single pulse in the pulsed electron beam 30 is set to be about 3.

FIG. 3A illustrates electrical coupling between irradiation point A of the sample 100 under examination and the amplifier 50, which corresponds to a situation in which a high-resistivity region 13 is present in the path of irradiated electrons that flows in the absorbed current. FIG. 3B is an exemplary pulse waveform 510 for the pulsed electron beam 30 as measured by the electrical current in the pulsed electron beam 30. For the purpose of comparison, the pulse waveform 510 for the pulsed electron beam 30 and the capacitance setting for the external capacitor 56 (which may have a fixed capacitance or a variable capacitance) can be the same between the settings of FIGS. 2A, 2B, 3A, and 3B.

FIG. 3C illustrates an exemplary waveform for 630 the time-dependent output voltage signal 60 from the amplifier 50 for the combination of the electrical coupling illustrated in FIG. 3A and the pulse waveform 510 illustrated in FIG. 3B. The waveform 520 of FIG. 2C is juxtaposed on the waveform 630 for comparison in FIG. 3C.

The added resistance in the path of the absorbed electrons (between the irradiation point A and the input node of the amplifier 50) due to the high-resistivity region 13 increases the RC time constant in the waveform 630 in the time-dependent output voltage signal 60 for the configuration of FIG. 3A with respect to the RC time constant in the waveform 520 in the time-dependent output voltage signal 60 for the configuration of FIG. 2A.

The cutoff frequency fc of the CR filter in the configuration of FIG. 3A is less than the cutoff frequency fc of the CR filter in the configuration of FIG. 2A. In case the change in the resistance in the path of the absorbed electrons is sufficient, the RC time constant in waveform 630 can be comparable with, or greater than, the duration of a single pulse in waveform 510. In this case, the peak magnitudes of pulses in the time-dependent output voltage signal 60 for the configuration of FIG. 3A (as manifested in the waveform 630) are less than the peak magnitudes of pulses in the time-dependent output voltage signal 60 for the configuration of FIG. 2A (as manifested in the waveform 520). The pulse signal rise times of pulses in the time-dependent output voltage signal 60 for the configuration of FIG. 3A (as manifested in the waveform 630) are greater than the pulse signal rise times of pulses in the time-dependent output voltage signal 60 for the configuration of FIG. 2A (as manifested in the waveform 520). The signal decay times in the time-dependent output voltage signal 60 for the configuration of FIG. 3A (as manifested in the waveform 630) are greater than the signal decay times in the time-dependent output voltage signal 60 for the configuration of FIG. 2A (as manifested in the waveform 520). An automated program can be run on a processor coupled with a memory to quantitatively characterize the variations in any, or each, of the peak magnitudes of pulses in the time-dependent output voltage signal 60, the pulse signal rise times of pulses in the time-dependent output voltage signal 60, and the signal decay times in the time-dependent output voltage signal 60.

Thus, presence of a high-resistivity region 13 (which may be embodied as a high resistance defective point that may not induce an electrical open) can be detected by a change in at least one measurement parameter selected from irradiation-location-dependent peak magnitudes of pulses in the time-dependent output voltage signal 60, irradiation-location-dependent pulse signal rise times of pulses in the time-dependent output voltage signal 60, and irradiation-location-dependent signal decay times in the time-dependent output voltage signal 60.

According to an aspect of the present disclosure, the pulsed electron beam 30 can be irradiated along the same scan path in the sample 100 under examination multiple times employing different scan parameters in order to facilitate detection of at least one high-resistivity region 13. For example, the pulsed electron beam 30 can be irradiated along the same scan path in the sample 100 under examination multiple times employing different pulse durations for electron pulses in the pulsed electron beam 30 during different scans.

According to an embodiment of the present disclosure, cut-off frequency changes depending on the resistance value of the high resistance defective location is utilized. Thus, the pulse duration (and/or the frequency) of the pulsed electron beam 30 can be made to vary, and the EBAC measurement is performed several times with different frequencies of electron beam pulses. If no high resistance portion is found in all of the measurements, it can be determined that there is no high resistance defect. In this way, the presence of the high resistance defective location can surely be determined.

Specifically, EBAC measurement is performed several times while shortening the time length of the pulses (raising the frequency of the electron beam). Due to this, even in the case where no high resistance defect is found in a certain frequency with a first pulse width as illustrated in FIG. 4A, the high resistance defect can be identified in the same frequency with a different pulse width as illustrated in FIG. 5A.

FIGS. 4A-4C and 5A-5C illustrate the mechanism by which changes in at least one measurement parameter selected from the irradiation-location-dependent peak magnitudes of pulses in the time-dependent output voltage signal 60, the irradiation-location-dependent pulse signal rise times of pulses in the time-dependent output voltage signal 60, and the irradiation-location-dependent signal decay times in the time-dependent output voltage signal 60 can be employed to determine local variations in resistivity of material portions underlying a scan path.

Figure 4A:
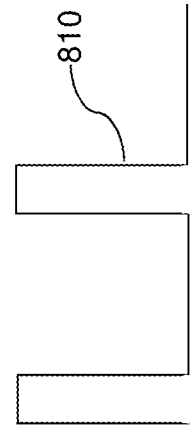
FIG. 4A is an exemplary pulse waveform for the electron beam having a high duty cycle according to an embodiment of the present disclosure.
Figure 4B:
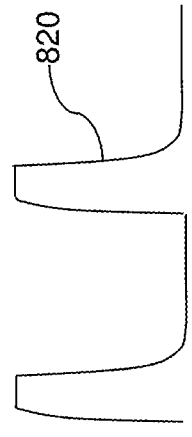
FIG. 4B is an exemplary waveform for the time-dependent output voltage signal from the amplifier in case the exemplary pulse waveform for the electron beam of FIG. 4A is employed in combination with a low resistance conductive path in the sample according to an embodiment of the present disclosure.
Figure 4C:
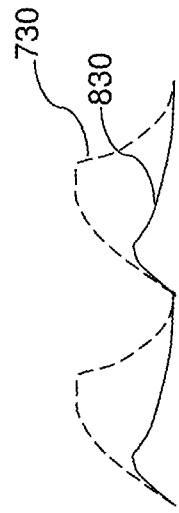
FIG. 4C is an exemplary waveform for the time-dependent output voltage signal from the amplifier in case the exemplary pulse waveform for the electron beam of FIG. 4A is employed in combination with a high resistance conductive path in the sample according to an embodiment of the present disclosure.

FIG. 4A illustrates a first electron pulse waveform 710 for a pulsed electron beam 30 that can be employed during a first scan along a predetermined path over the sample 100 under examination. The first electron pulse waveform 710 has a first pulse duration. FIG. 4B illustrates a first low-resistance-path waveform 720, which is a time-dependent output voltage signal 60 from the configuration of FIG. 2A (i.e., while the absorption current flows through a conductive path that does not include a high-resistivity region 13) during the first scan in which a pulsed electron beam 30 having the first electron pulse waveform 710 of FIG. 4A is employed. FIG. 4C illustrates a first high-resistance-path waveform 730, which is a time-dependent output voltage signal 60 from the configuration of FIG. 3A (i.e., while the absorption current flows through a conductive path that includes a high-resistivity region 13) during the first scan in which a pulsed electron beam 30 having the first electron pulse waveform 710 of FIG. 4A is employed.

Figure 5A:
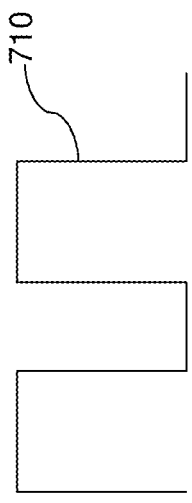
FIG. 5A is an exemplary pulse waveform for the electron beam having a low duty cycle according to an embodiment of the present disclosure.
Figure 5B:
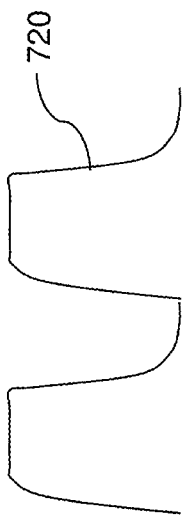
FIG. 5B is an exemplary waveform for the time-dependent output voltage signal from the amplifier in case the exemplary pulse waveform for the electron beam of FIG. 5A is employed in combination with a low resistance conductive path in the sample according to an embodiment of the present disclosure.
Figure 5C:
FIG. 5C is an exemplary waveform for the time-dependent output voltage signal from the amplifier in case the exemplary pulse waveform for the electron beam of FIG. 5A is employed in combination with a high resistance conductive path in the sample according to an embodiment of the present disclosure.

FIG. 5A illustrates a second electron pulse waveform 810 for a pulsed electron beam 30 that can be employed during a second scan along the predetermined path over the sample 100 under examination. The second electron pulse waveform 810 has a second pulse duration that is less than the first pulse duration. The second pulse duration can be shorter than the first pulse duration by a factor in a range from 1.5 to 10,000, although lesser and greater factors can also be employed. The second electron pulse waveform 810 may, or may not, have the same frequency as the first electron pulse waveform 710. In case the second electron pulse waveform 810 has the same frequency as the first electron pulse waveform 710, the duty cycle of the second electron pulse waveform 810 can be less than the duty cycle of the first electron pulse waveform 710. FIG. 5B illustrates a second low-resistance-path waveform 820, which is a time-dependent output voltage signal 60 from the configuration of FIG. 2A (i.e., while the absorption current flows through a conductive path that does not include a high-resistivity region 13) during the second scan in which a pulsed electron beam 30 having the second electron pulse waveform 810 of FIG. 5A is employed. FIG. 5C illustrates a second high-resistance-path waveform 830, which is a time-dependent output voltage signal 60 from the configuration of FIG. 3A (i.e., while the absorption current flows through a conductive path that includes a high-resistivity region 13) during the second scan in which a pulsed electron beam 30 having the second electron pulse waveform 810 of FIG. 5A is employed. The first high-resistance-path waveform 730 is juxtaposed on the second high-resistance-path waveform 830.

For the scan configuration of FIG. 2A, i.e., when the absorption current does not flow through any high-resistivity region 13, FIG. 4B illustrates the time-dependent output voltage signal 60 for the first electron pulse waveform 710 and FIG. 5B illustrates the time-dependent output voltage signal for the second electron pulse waveform 810 that has a lesser pulse duration than the first electron pulse waveform 710. In this case, parameters such as peak magnitudes of pulses in the time-dependent output voltage signal 60, pulse signal rise times of pulses in the time-dependent output voltage signal, and signal decay times in the time-dependent output voltage signal 60 do not change based on the change of the pulse duration, i.e., do not change between the case of the first low-resistance-path waveform 720 and the second low-resistance-path waveform 820.

For the scan configuration of FIG. 3A, i.e., when the absorption current flows through a high-resistivity region 13, FIG. 4C illustrates the time-dependent output voltage signal 60 for the first electron pulse waveform 710 and FIG. 5C illustrates the time-dependent output voltage signal for the second electron pulse waveform 810 that has a lesser pulse duration than the first electron pulse waveform 710. In this case, parameters such as peak magnitudes of pulses in the time-dependent output voltage signal 60, pulse signal rise times of pulses in the time-dependent output voltage signal, and signal decay times in the time-dependent output voltage signal 60 can change significantly based on the change of the pulse duration, i.e., changes significantly between the case of the first high-resistance-path waveform 730 and the second high-resistance-path waveform 830.

Thus, detection of presence of a high-resistivity region 13 within a scan path can be facilitated by performing multiple scans having different pulse durations. In one embodiment, a change in the measurement parameter of the time-dependent output voltage signal 60 can be measured at one or more locations along the scan path as a function of a pulse duration for the electron pulses in the pulsed electron beam 30 to determine the presence of a change in local resistivity within the sample 100 under examination.

In one embodiment, the measurement parameter can comprise irradiation-location-dependent peak magnitudes of pulses in the time-dependent output voltage signal 60, and a decrease in the irradiation-location-dependent peak magnitudes of pulses in the time-dependent output voltage signal 60 at a same irradiation point at a shorter pulse duration can correlate with an increase in the local resistivity.

In another embodiment, the measurement parameter can comprise irradiation-location-dependent signal rise times of pulses in the time-dependent output voltage signal 60, and an increase in the irradiation-location-dependent signal rise times of pulses in the time-dependent output voltage signal 60 at a same irradiation point at a shorter pulse duration can correlate with an increase in the local resistivity.

In yet another embodiment, the measurement parameter can comprise irradiation-location-dependent signal decay times of pulses in the time-dependent output voltage signal 60, and an increase in the irradiation-location-dependent signal decay times of pulses in the time-dependent output voltage signal 60 at a same irradiation point at a shorter pulse duration can correlate with an increase in the local resistivity.

According to another aspect of the present disclosure, the cut-off frequency changes depending on the resistance value of the high resistance defective location. Thus, the capacitance of the CR filter is made to differ, and the EBAC measurement is performed several times with different capacitances. If no high resistance portion is found in all of the measurements, it can be determined that there is no high resistance defect. In this way, the presence of the high resistance defective location can be determined.

Specifically, the total capacitance between the amplifier 50 and electrical ground is provided by connecting a capacitor (i.e., the external capacitor 56) configured to provide a variable capacitance between the conductive probe (40, 41) and electrical ground and selecting different capacitance settings on the capacitor during the different scans. In this configuration, a capacitance of the filter is added, to implement the EBAC. The external capacitance Ca is inserted between the ground and the amplifier as illustrated in FIG. 1. By adjusting the external capacitance Ca of the filter, the cut-off frequency can be optimized for identifying high resistance point.

FIGS. 6A-6C and 7A-7C illustrate the mechanism by which a change in the total capacitance between the input node of the amplifier 50 and electrical ground can be employed to measure a changes in at least one measurement parameter selected from the irradiation-location-dependent peak magnitudes of pulses in the time-dependent output voltage signal 60, the irradiation-location-dependent pulse signal rise times of pulses in the time-dependent output voltage signal 60, and the irradiation-location-dependent signal decay times in the time-dependent output voltage signal 60 can be employed to determine local variations in resistivity of material portions underlying a scan path.

Figure 6A:
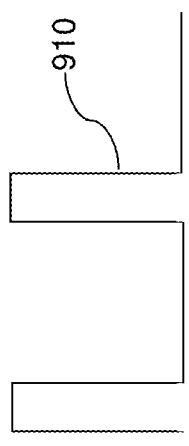
FIG. 6A is an exemplary pulse waveform for the electron beam employed in conjunction with a low input capacitance setting for the amplifier according to an embodiment of the present disclosure.
Figure 6B:
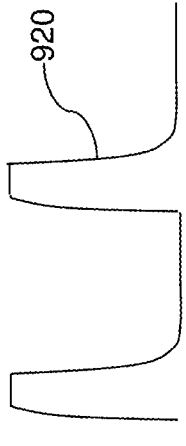
FIG. 6B is an exemplary waveform for the time-dependent output voltage signal from the amplifier for the case of the pulsed electron beam of FIG. 6A, a low input capacitance setting for the amplifier, and a low resistance conductive path in the sample according to an embodiment of the present disclosure.
Figure 6C:
FIG. 6C is an exemplary waveform for the time-dependent output voltage signal from the amplifier for the case of the pulsed electron beam of FIG. 6A, the low input capacitance setting for the amplifier, and a high resistance conductive path in the sample according to an embodiment of the present disclosure.

A pair of scans can be employed with two different input capacitance settings, which are herein referred to as a first scan and a second scan, respectively. FIG. 6A illustrates an electron pulse waveform 910 for a pulsed electron beam 30 that is employed during the first scan along a predetermined path over the sample 100 under examination with a first input capacitance setting for the amplifier. The first input capacitance setting can employ a first value for the total capacitance Cp+Ca. The electron pulse waveform 910 has a fixed pulse duration. FIG. 6B illustrates a first low-resistance-path waveform 920, which is a time-dependent output voltage signal 60 from the configuration of FIG. 2A (i.e., while the absorption current flows through a conductive path that does not include a high-resistivity region 13) during the first scan in which a pulsed electron beam 30 having the electron pulse waveform 910 of FIG. 6A is employed. FIG. 6C illustrates a first high-resistance-path waveform 930, which is a time-dependent output voltage signal 60 from the configuration of FIG. 3A (i.e., while the absorption current flows through a conductive path that includes a high-resistivity region 13) during the first scan that employs a first capacitance value is selected for the external capacitance Ca.

Figure 7A:
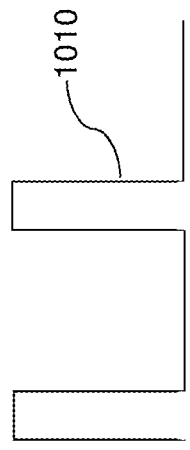
FIG. 7A is an exemplary pulse waveform for the electron beam employed in conjunction with a high input capacitance setting for the amplifier according to an embodiment of the present disclosure.
Figure 7B:
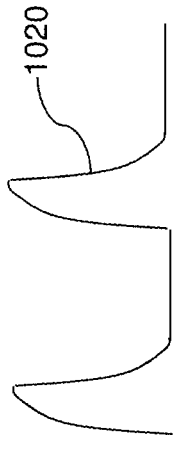
FIG. 7B is an exemplary waveform for the time-dependent output voltage signal from the amplifier for the case of the pulsed electron beam of FIG. 7A, a high input capacitance setting for the amplifier, and a low resistance conductive path in the sample according to an embodiment of the present disclosure.
Figure 7C:
FIG. 7C is an exemplary waveform for the time-dependent output voltage signal from the amplifier for the case of the pulsed electron beam of FIG. 7A, the high input capacitance setting for the amplifier, and a high resistance conductive path in the sample according to an embodiment of the present disclosure.

FIG. 7A illustrates an electron pulse waveform 1010 for a pulsed electron beam 30 that is employed during the second scan along the predetermined path over the sample 100 under examination. The electron pulse waveform 1010 employed for the second scan can be identical to the electron pulse waveform 910 employed for the first scan. The first scan and the second scan can have the same scan path, and can differ only by the input capacitance setting for the amplifier. FIG. 7B illustrates a second low-resistance-path waveform 1020, which is a time-dependent output voltage signal 60 from the configuration of FIG. 2A (i.e., while the absorption current flows through a conductive path that does not include a high-resistivity region 13). FIG. 7C illustrates a second high-resistance-path waveform 1030, which is a time-dependent output voltage signal 60 from the configuration of FIG. 3A (i.e., while the absorption current flows through a conductive path that includes a high-resistivity region 13) during the second scan in which a second capacitance value is selected for the external capacitance Ca. The second capacitance value is greater than the first capacitance value by a factor in a range from 1.2 to 10,000. For example, the second capacitance value can be grater than the first capacitance value by a factor in a range from 3 to 1,000.

For the scan configuration of FIG. 2A, i.e., when the absorption current does not flow through any high-resistivity region 13, FIG. 6B illustrates the time-dependent output voltage signal 60 for the first capacitance value for the external capacitance Ca and FIG. 7B illustrates the time-dependent output voltage signal for the second capacitance value for the external capacitance Ca that is greater than the first capacitance value. In this case, peak magnitudes of pulses in the time-dependent output voltage signal 60 may not change significantly.

For the scan configuration of FIG. 3A, i.e., when the absorption current flows through a high-resistivity region 13, FIG. 6C illustrates the time-dependent output voltage signal 60 for the first capacitance value for the external capacitance Ca and FIG. 7C illustrates the time-dependent output voltage signal for the second capacitance value for the external capacitance Ca that is greater than the first capacitance value. In this case, parameters such as peak magnitudes of pulses in the time-dependent output voltage signal 60, pulse signal rise times of pulses in the time-dependent output voltage signal, and signal decay times in the time-dependent output voltage signal 60 can change significantly based on the change of the pulse duration, i.e., changes significantly between the case of the first high-resistance-path waveform 930 and the second high-resistance-path waveform 1030.

In one embodiment, the single probe resistivity measurement device can be configured to measure a change in a measurement parameter of a time-dependent output voltage signal from the amplifier at one or more locations along a scan path as a function of a total capacitance between the amplifier and electrical ground, a decrease in the measurement parameter in the time-dependent output voltage signal at an irradiation point at a greater total capacitance between the amplifier 50 and electrical ground correlates with an increase in local resistivity at the irradiation point.

In one embodiment, the measurement parameter can be selected from irradiation-location-dependent signal rise times of pulses in the time-dependent output voltage signal 60 and irradiation-location-dependent signal decay times of pulses in the time-dependent output voltage signal 60. In this case, the external capacitor 56 can be a variable capacitor that can provide different RC time constants based on the selected value of the added capacitance Ca from the external capacitor 56. In this case, the pulsed electron beam 30 can be irradiated along the same scan path in the sample 100 under examination multiple times while the amplifier 50 is coupled to electrical ground with different total capacitances during different scans.

In one embodiment, a change in the measurement parameter of the time-dependent output voltage signal 60 can be measured at one or more locations along the scan path as a function of a total capacitance (as selected by the set values for the capacitance of the external capacitor 56) between the amplifier and electrical ground. In this case, the measurement parameter can be selected from the irradiation-location-dependent pulse signal rise times of pulses in the time-dependent output voltage signal and the irradiation-location-dependent signal decay times in the time-dependent output voltage signal, and an increase in the measurement parameter in the time-dependent output voltage signal 60 at a same irradiation point at a greater total capacitance between the amplifier 50 and electrical ground correlates with an increase in the local resistivity.

According to another aspect of the present disclosure, a sample and hold circuitry 70 can be added to the current path before, or after, the amplifier 50 (as illustrated in FIG. 1). In this case, the peak value of the time-dependent output voltage signal 60 as measured by the amplifier 50 can be held as illustrated in FIGS. 8A-8C and 9A-9C. The presence of the high resistance defective location can be determined utilizing the processed signal indicating the peak amplitude.

Figure 8A:
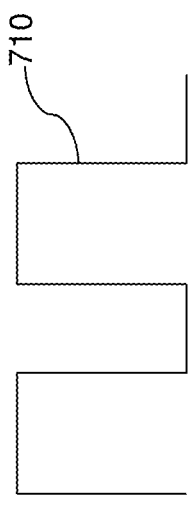
FIG. 8A is an exemplary pulse waveform for the electron beam having a high duty cycle according to an embodiment of the present disclosure.
Figure 8B:
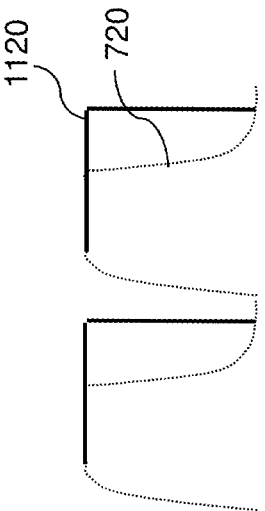
FIG. 8B is an exemplary processed waveform from a sample and hold circuitry in case the exemplary pulse waveform for the electron beam of FIG. 8A is employed in combination with a low resistance conductive path in the sample according to an embodiment of the present disclosure.
Figure 8C:
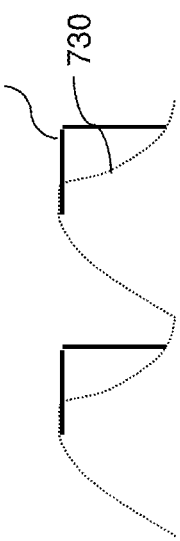
FIG. 8C is an exemplary waveform from a sample and hold circuitry in case the exemplary pulse waveform for the electron beam of FIG. 8A is employed in combination with a high resistance conductive path in the sample according to an embodiment of the present disclosure.

FIGS. 8A-8C compare the various signals in FIGS. 4A-4C, respectively, with processed signals (1120, 1130) from the sample and hold circuitry 70. FIG. 8A illustrates the first electron pulse waveform 710 of FIG. 4A. FIG. 8B illustrates a processed signal 1120 derived from the first low-resistance-path waveform 720 shown in FIG. 4B. FIG. 8C illustrates a processed signal 1130 derived from the first high-resistance-path waveform 730.

Figure 9A:
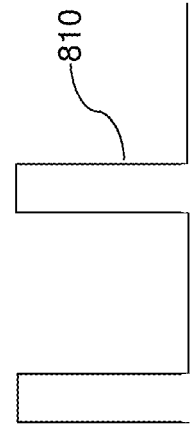
FIG. 9A is an exemplary pulse waveform for the electron beam having a low duty cycle according to an embodiment of the present disclosure.
Figure 9B:
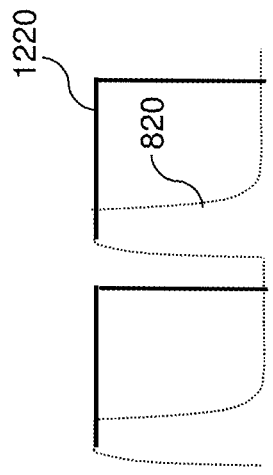
FIG. 9B is an exemplary waveform from a sample and hold circuitry in case the exemplary pulse waveform for the electron beam of FIG. 9A is employed in combination with a low resistance conductive path in the sample according to an embodiment of the present disclosure.
Figure 9C:
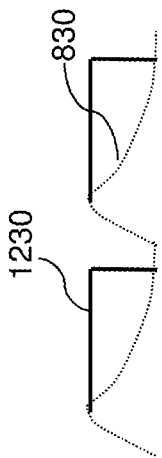
FIG. 9C is an exemplary waveform from a sample and hold circuitry in case the exemplary pulse waveform for the electron beam of FIG. 9A is employed in combination with a high resistance conductive path in the sample according to an embodiment of the present disclosure.

Likewise, FIGS. 9A-9C compare the various signals in FIGS. 5A-5C, respectively, with processed signals (1220, 1230) from the sample and hold circuitry 70. FIG. 9A illustrates the second electron pulse waveform 810 of FIG. 5A. FIG. 9B illustrates a processed signal 1220 derived from the second low-resistance-path waveform 820 shown in FIG. 5B. FIG. 9C illustrates a processed signal 1230 derived from the second high-resistance-path waveform 830.

Any of the waveforms for the time-dependent output voltage signal 60 can be processed by the sample and hold circuitry 70 to generate a signal that measures the peak value in the time-dependent output voltage signal 60.

Generally speaking, any time-dependent output voltage signal 60 can be converted into a processed time-dependent output voltage signal employing the sample and hold circuitry 70, which can be configured to hold a peak magnitude of the time-dependent output voltage signal 60 for a duration that is less than a period of the pulsed electron beam 30. The measurement parameter can comprise the irradiation-location-dependent peak magnitudes of pulses in the time-dependent output voltage signal 60 as measured through the processed time-dependent output voltage signal.

In one embodiment, the single probe resistivity measurement device can be configured to automatically repeat multiple scans on a same scan path multiple times with different settings for capacitance for the variable capacitor.

In one embodiment, the e-beam prober can generate a SEM image by raster-scanning a focused electron beam over a selected region of the conductive structure 10. The high energy electrons in the primary beam strike the surface of the conductive structure 10, producing a number of low energy secondary electrons. The secondary electrons are guided back up through the SEM column to a detector. The varying numbers of secondary electrons reaching the detector are interpreted to produce the SEM image.

According to another aspect of the present disclosure, the calculated local variations in resistivity of material portions underlying each scan path can be converted into a graphic output indicating local resistivity distribution within an area of the scan path. In one embodiment, the pulsed electron beam 30 can be irradiated along additional scan paths that are parallel to the scan path to measure the change in the measurement parameter within the area of the sample under examination. In one embodiment, the additional scan paths may be parallel among one another. In this case, a two-dimensional map of local variations in resistivity of the sample 100 can be generated by compiling the resistivity data from each scan.

Figure 10:
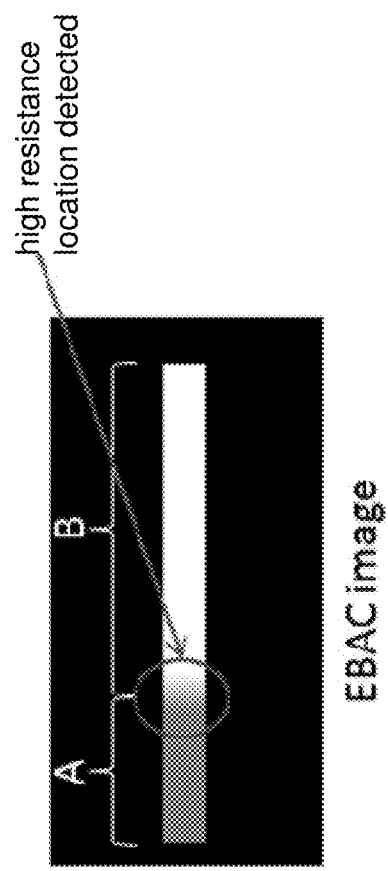
FIG. 10 is an electron beam absorbed current (EBAC) image generated from the single probe resistivity measurement device and the sample under examination of FIG. 1 according to an embodiment of the present disclosure.

FIG. 10 illustrates an exemplary electron beam absorbed current (EBAC) image generated from the single probe resistivity measurement device and the sample under examination of FIG. 1. The gradient in the brightness (or darkness) of the image is proportional to the local resistivity. For example, the encircled region in the image of FIG. 10 indicates a high resistance location, which is not a site of an electrical open, but includes a structure having a high electrical resistivity.

Figure 11:
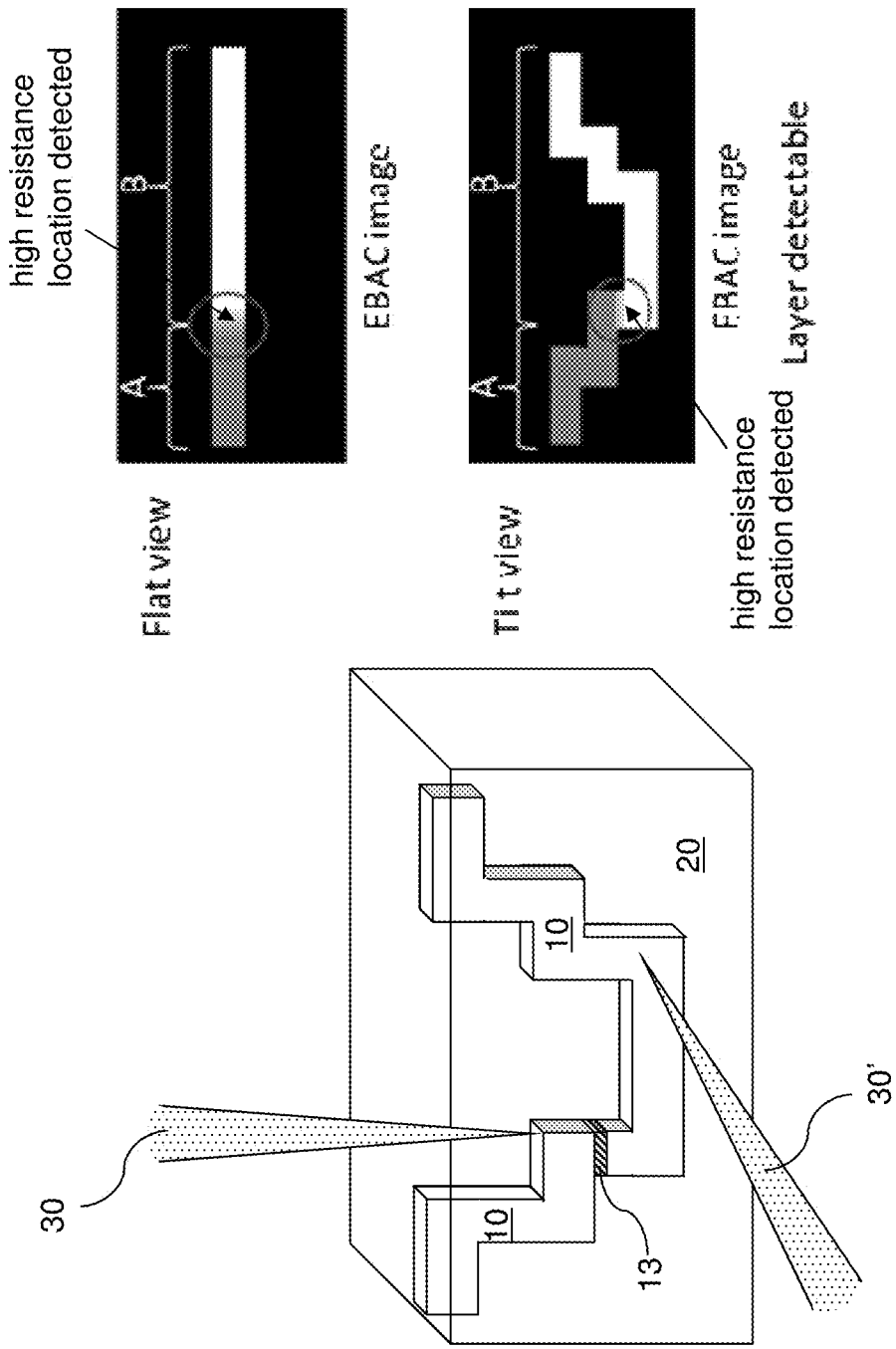
FIG. 11 is a schematic diagram illustrating exemplary two-dimensional maps of local variations in resistivity of the sample, which can be employed to generate three-dimensional coordinates of locations having local variations in resistivity within the sample, according to an embodiment of the present disclosure.

According to another aspect of the present disclosure, the sample 100 under examination can be tilted with respect to the initial direction of the pulsed electron beam 30 by rotating the sample 100 and/or the electron beam source 200. For example, the sample 100 or the pulsed electron beam 30 can be rotated such that a newly oriented pulsed electron beam 30' irradiates the sample 100 from a different angle. The sample 100 and/or the pulsed electron beam 30 can be tilted sideways or at any non-zero angle as illustrated in FIG. 11. In this way, the location of a high-resistivity region 13 can be determined along a different beam direction. For example, if the sample 100 under examination includes a metal interconnect structure including a high-resistance defect region, the x-y coordinates of the high-resistance defect region can be determined by a series of scans employing a pulsed electron beam 30 irradiated along the z-direction, and subsequently, x-z coordinates of the high-resistant defect region can be determined by a serried of scans employing a pulsed electron beam 30' irradiated along the y direction.

FIG. 11 is a schematic diagram illustrating configurations for illuminating a pulsed electron beam (30 or 30') from two different directions to generate multiple two-dimensional maps of local variations in resistivity of the sample 100. The multiple two-dimensional maps can be employed to generate three-dimensional coordinates of locations having local variations in resistivity within the sample 100.

Generally speaking, after performing a scan employing a scan path on a surface of a sample 100, the pulsed electron beam 30 can be irradiated along additional scan paths on different surfaces of the sample 100 at least once. The additional scan paths can overlie the conductive structure 10 within the sample 100 along a different direction than the previously employed scan path. A change in the measurement parameter of the time-dependent output voltage signal 60 can be measured as the irradiated pulsed electron beam 30 moves along the additional scan path. A three-dimensional coordinates of locations having local variations in resistivity within the sample 100 can be generated.

In one embodiment, the pulsed electron beam 30 emits packets of electrons with a substantially square waveform. In one embodiment, the sample 100 comprises at least one conductive structure 10 embedded in a dielectric matrix 20 and includes at least one region having local resistivity above an average resistivity of the at least one conductive structure 10, i.e., a high-resistivity region 13. The measured measurement parameter can be converted into a change in brightness or color in an output image.

In one embodiment, the pulsed electron beam 30 can be a focused electron beam having a lesser lateral dimension at an irradiation point than at a maximum-width region located between an outlet opening of an electron gun emitting the pulsed electron beam 30 and the irradiation point.

In case the single probe resistivity measurement device includes a variable capacitor as an external capacitor 56 that is connected between the amplifier 50 and electrical ground, the variable capacitor can be configured to provide one setting among a plurality of settings for capacitance between the amplifier 50 and the electrical ground. In this case, the single probe resistivity measurement device can be configured to automatically repeat multiple scans on a same scan path multiple times with different settings for capacitance for the variable capacitor. In one embodiment, the single probe resistivity measurement device can be configured to measure a change in a measurement parameter of a time-dependent output voltage signal 60 from the amplifier 50 at one or more locations along a scan path as a function of a total capacitance between the amplifier and electrical ground. Data for the same irradiation point can be compared for different settings for the external capacitor. For example, data generated under a low external capacitance setting (such as data illustrated in FIGS. 6B and 6C) can be compared with data generated under a high external capacitance setting (such as data illustrated in FIGS. 7B and 7C) illumination point by illumination point employing a program that runs on a computer. A change in the measurement parameter in the time-dependent output voltage signal 60 at an irradiation point at a greater total capacitance between the amplifier 50 and electrical ground can be correlated with an increase in local resistivity at the irradiation point.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. An electron beam absorbed current measurement method, comprising:
   connecting a conductive probe to a conductive structure of a sample;
   irradiating a pulsed electron beam at least once along the conductive structure to generate an alternating current in the conductive probe; and
   determining a presence of a high resistance defect in the conductive structure based on a delay of a rising edge of the alternating current waveform;
   wherein irradiating the pulsed electron beam at least once comprises irradiating the pulsed electron beam a plurality of times to perform plural scans along the conductive structure, wherein each of the plural scans uses a respective external capacitance electrically connected between ground and an input node of an amplifier electrically connected to the conductive probe, the respective external capacitance being different from external capacitances for other scans among the plural scans, and the differences among the external capacitances among the plural scans being provided by increase or decrease of the capacitance between ground and the input node of the amplifier.

2. An electron beam absorbed current measurement method, comprising:
   connecting a conductive probe to a conductive structure of a sample;
   irradiating a pulsed electron beam at least once along the conductive structure to generate an alternating current in the conductive probe; and
   determining a presence of a high resistance defect in the conductive structure based on a delay of a rising edge of the alternating current waveform;
   wherein the conductive structure comprises a conductive interconnect embedded in a dielectric matrix located over a substrate;
   wherein the interconnect is electrically connected to semiconductor device located over the substrate; and
   wherein irradiating the pulsed electron beam at least once comprises irradiating the pulsed electron beam a plurality of times to perform plural scans, wherein the conductive structure is tilted relative to the pulsed electron beam in at least one of the plural scans to determine a location of the high resistivity defect in a conductive via portion of the conductive interconnect as a function of height of the conductive via.

3. An electron beam absorbed current measurement method, comprising:
   connecting a conductive probe to a conductive structure of a sample;
   irradiating a pulsed electron beam at least once along the conductive structure to generate an alternating current in the conductive probe; and
   determining a presence of a high resistance defect in the conductive structure based on a delay of a rising edge of the alternating current waveform;
   wherein:
   irradiating the pulsed electron beam at least once comprises irradiating the pulsed electron beam a plurality of times to perform plural scans;
   the delay of the rising edge of the alternating current waveform is determined, for each of the plural scans, by measuring a signal rise time of the alternating current waveform; and
   the signal rise time is measured, for each of the plural scans, by fitting the rising edge of the alternating current waveform to an exponential function and calculating, by running an automated program on a processor coupled with a memory, a time constant of a fitted curve that provides a best fit to the rising edge of the alternating current waveform.

* * * * *